United States Patent
Kubo (10) Patent No.: US 10,309,131 B2
(45) Date of Patent: Jun. 4, 2019

(54) CAPACITIVE PROXIMITY SENSOR AND DOOR HANDLE DEVICE COMPRISING THE CAPACITIVE PROXIMITY SENSOR

(71) Applicant: Tokyo Parts Industrial Co., Ltd., Gunma-ken (JP)

(72) Inventor: Mamoru Kubo, Gunma-ken (JP)

(73) Assignee: Tokyo Parts Industrial Co., Ltd. (JP)

( * ) Notice: Subject to any disclaimer, the term of this patent is extended or adjusted under 35 U.S.C. 154(b) by 188 days.

(21) Appl. No.: 15/473,950

(22) Filed: Mar. 30, 2017

(65) Prior Publication Data

US 2017/0350169 A1    Dec. 7, 2017

(30) Foreign Application Priority Data

Jun. 7, 2016 (JP) ................. 2016-113249

(51) Int. Cl.
| | |
|---|---|
| G01R 27/26 | (2006.01) |
| E05B 85/10 | (2014.01) |
| G01D 5/24 | (2006.01) |
| H03K 17/955 | (2006.01) |

(52) U.S. Cl.
CPC .............. *E05B 81/77* (2013.01); *E05B 85/10* (2013.01); *G01D 5/24* (2013.01); *G01D 5/2405* (2013.01); *H03K 17/955* (2013.01); *G07C 2209/65* (2013.01); *H03K 2217/960705* (2013.01); *H03K 2217/960755* (2013.01)

(58) Field of Classification Search
USPC ................................. 324/658–690
See application file for complete search history.

(56) References Cited

U.S. PATENT DOCUMENTS

| | | | | |
|---|---|---|---|---|
| 2002/0030594 | A1* | 3/2002 | Inaba | .............. B60R 25/246 340/562 |
| 2012/0074963 | A1* | 3/2012 | Hagimoto | ............ G01D 5/24 324/679 |

FOREIGN PATENT DOCUMENTS

| | | |
|---|---|---|
| JP | 2002-039708 | 2/2002 |
| JP | 2002-057564 | 2/2002 |

* cited by examiner

*Primary Examiner* — Vincent Q Nguyen
(74) *Attorney, Agent, or Firm* — Jordan and Koda, PLLC (57) ABSTRACT

The resonance frequency of an LCR resonance circuit is f1 and the determination voltage signal is V1, when an object is not in the proximity of a sensor electrode. The resonance frequency of the LCR resonance circuit is f2 and the determination voltage signal is V2, when a human body is in proximity of the sensor electrode 22. The resonance frequency of the LCR resonance circuit is f3 and the determination voltage signal is V3, when water is in the proximity of the sensor electrode. The LCR resonance circuit has the relationship f1>f2>f3. A control unit controls a high-frequency signal S0 so as to satisfy the relationship V2>V1>V3, and a human body or water being in the proximity of the sensor electrode is distinguished.

7 Claims, 10 Drawing Sheets

CAPACITIVE PROXIMITY SENSOR AND DOOR HANDLE DEVICE COMPRISING THE CAPACITIVE PROXIMITY SENSOR

BACKGROUND

1. Technical Field

The present invention relates to a capacitive proximity sensor installed, for example, in a door handle of a vehicle equipped with a keyless entry system or the like, which detects the proximity or contact of a human body (hand or the like), and to a door handle device comprising this capacitive proximity sensor.

2. Related Art

Recently, automobiles are equipped with keyless entry systems, which can lock and unlock doors without key operations. Keyless entry systems comprise: an authentication unit provided within the vehicle; a portable device carried by a user; a proximity sensor, provided on a door handle at the exterior of the vehicle, which detects contact when a user contacts a predetermined position on the door handle; a locking unit, which locks the door; and an unlocking unit, which unlocks the door.

Known proximity sensors include capacitive proximity sensors, which detect the proximity of an object on the basis of changes in the capacitance of a sensor electrode.

Japanese Patent Laid-Open Publication No. 2002-39708 describes a capacitive proximity sensor in which a series resonance circuit is formed, having a resonance frequency fr, in which a resonant capacitance is the capacitance of a resonance circuit, which includes the electrode capacitance of a sensor electrode, and this resonant capacitance and a resonant inductor are connected in series, this series resonance circuit being caused to resonate at an excitation frequency f0 that is higher than the resonance frequency fr, and objects are detected on the basis of the resonance voltage of this series resonance circuit.

With the capacitive proximity sensor described in Japanese Patent Laid-Open Publication No. 2002-39708, by setting the excitation frequency f0 higher than the resonance frequency fr, the resonance voltage will always decrease when an object approaches the sensor electrode, and therefore it is possible to detect the object from the change in the resonance voltage.

Furthermore, Japanese Patent Laid-Open Publication No. 2002-57564 discloses a human body detector, which detects only human bodies, distinguishing between human bodies and raindrops, on the basis of changes in the output frequency, or the output within a predetermined time, when the output of a capacitive sensor is received.

However, in the capacitive proximity sensor described in Japanese Patent Laid-Open Publication No. 2002-39708, only the decrease in the resonance voltage, as compared to the state in which an object is not present in the vicinity of the sensor electrode, is detected, and therefore it is essentially not possible to distinguish between different objects (for example, a human body and water).

Furthermore, the human body detector described in Japanese Patent Laid-Open Publication No. 2002-57564 is premised on the output changing more rapidly when contact is made by water than when contact is made by a human body, but depending on changes in the environment, such as temperature, and depending on the circuit constants of the detection circuit, it can be difficult to distinguish between a human body and water.

SUMMARY

One or more embodiments of the present invention provide a capacitive proximity sensor that can more reliably distinguish between a human body and water.

Furthermore, one or more embodiments of the present invention provide a door handle device comprising a capacitive proximity sensor that can more reliably distinguish between a human body and water.

Note that, in the aspects described below, the constituent elements employed can be used in the most freely chosen combinations possible. Furthermore, the aspects and technical features of the present invention are not limited to those described hereafter, and are to be understood based on the description in the entire specification and the drawings, or based on the inventive ideas that can be grasped by the skilled artisan on the basis of these descriptions.

A first aspect of the present invention relating to a capacitive proximity sensor comprises:

an oscillation means, which outputs a high-frequency signal;

a sensor circuit, having an LCR resonance circuit, including a sensor electrode, into which the high-frequency signal is input, and which outputs a determination voltage signal in accordance with the capacitance of the sensor electrode; and a control unit, which detects the proximity of a human body to the sensor electrode, on the basis of the determination voltage signal, wherein when:

the resonance frequency of the LCR resonance circuit is f1 and the determination voltage signal is V1, when an object is not in the proximity of the sensor electrode, the resonance frequency of the LCR resonance circuit is f2 and the determination voltage signal is V2, when a human body is in the proximity of the sensor electrode, and the resonance frequency of the LCR resonance circuit is f3 and the determination voltage signal is V3, when water is in the proximity of the sensor electrode, having the relationship $f1 > f2 > f3$, the control unit controls the high-frequency signal so as to satisfy the relationship $V2 > V1 > V3$ or $V3 > V1 > V2$ and a human body or water being in the proximity of the sensor electrode is distinguished.

A second aspect of the present invention relating to a capacitive proximity sensor is that:

the control unit controls the frequency of the high-frequency signal so that V1 is substantially constant.

A third aspect of the present invention relating to a capacitive proximity sensor is that:

the control unit performs control so that the frequency of the high-frequency signal is substantially constant.

Furthermore, a fourth aspect of the present invention relating to a door handle device comprises:

a door handle mounted to an outer panel of a vehicle door, and a capacitive proximity sensor, wherein the door handle has a space at the interior thereof, and the capacitive proximity sensor is disposed within the space.

Furthermore, in a fifth aspect of the present invention relating to a door handle device:

the capacitive proximity sensor is formed on a board;

the board is disposed so that the sensor electrode faces the outer panel side; and a shield electrode is formed on the back face of the board on which the sensor electrode is not formed.

Furthermore, in a sixth aspect of the present invention relating to a door handle device:

the surface of the door handle is electroconductive.

With the capacitive proximity sensor and the door handle device according to one mode of embodiment of the present invention, starting from a state in which an object is not in the proximity of the sensor electrode, the determination voltage signal changes in opposite directions, in the case in which a human body is in the proximity of the sensor electrode and the case in which water is in the proximity of the sensor electrode, such that a human body and water can be reliably distinguished.

DETAILED DESCRIPTION OF THE PREFERRED EMBODIMENTS

Hereafter, exemplary modes of embodiment of the present invention are described with reference to the drawings.

First Exemplary Mode of Embodiment

The capacitive proximity sensor according to the first exemplary mode of embodiment of the present invention can be used as a sensor for locking and unlocking the doors of a vehicle in a so-called keyless entry system. In this case, the sensor electrode is provided within a door handle, which serves as a manipulated member, and is disposed at a predetermined position so that contact can be detected when a user touches a predetermined face of the door handle.

Figure 1:
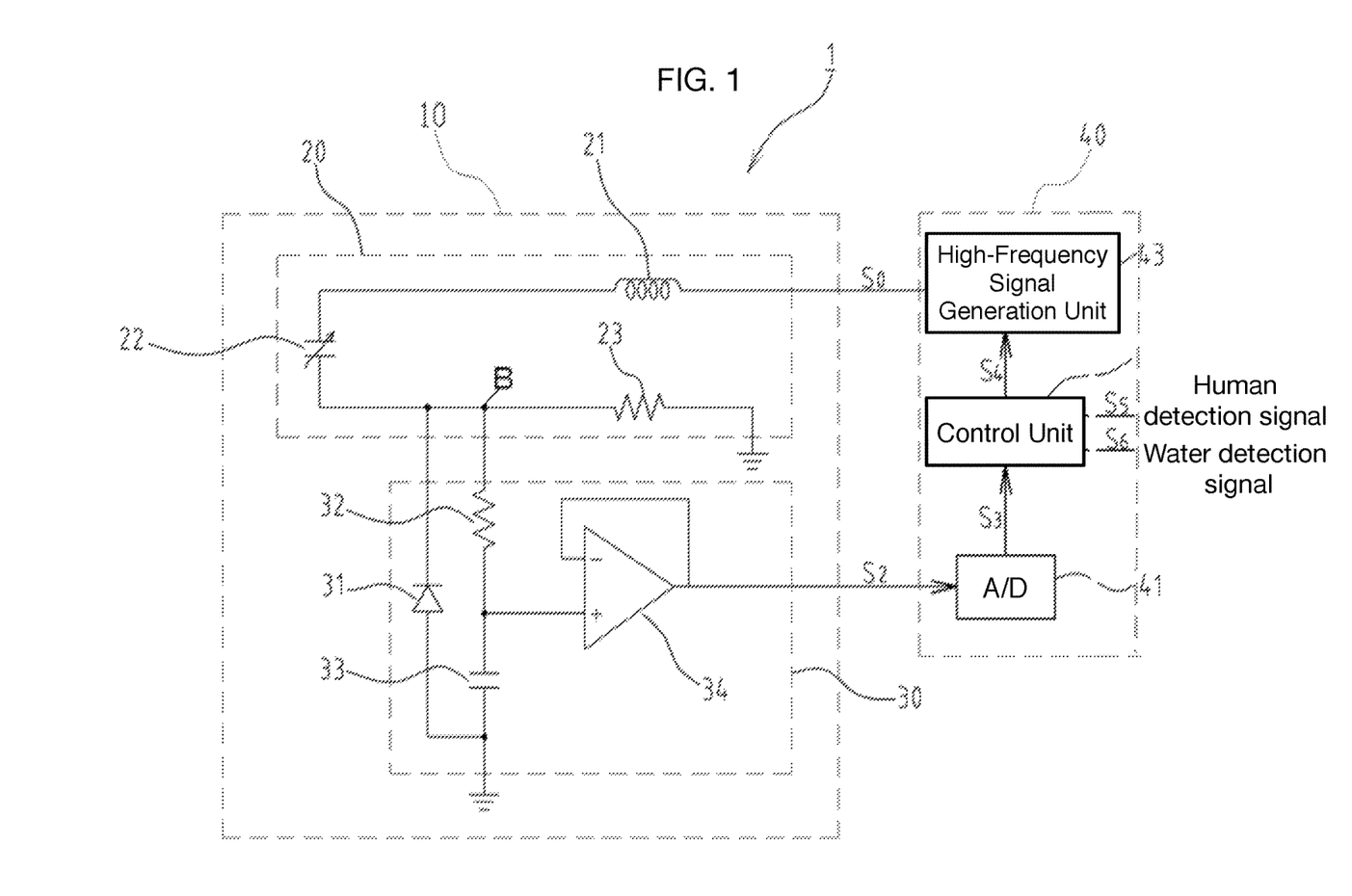
FIG. 1 is a block diagram showing the general configuration of a proximity sensor according to a first exemplary mode of embodiment of the present invention.

As shown in the block diagram in FIG. 1, the proximity sensor 1 in this example comprises primarily a sensor circuit 10 and a microcomputer 40, the sensor circuit 10 comprising an LCR resonance circuit 20 and a smoothing circuit 30.

The LCR resonance circuit 20 in this example is one in which an inductor (coil) 21, a sensor electrode (variable capacitance) 22, in which the capacitance increases when a dielectric such as a human body approaches or contacts it, and a fixed resistor 23 are connected in series. The capacitance of this sensor electrode 22 includes the capacitance between the sensor electrode 22 and the vehicle door main body, door handle or the like, and is increased by the proximity of a dielectric such as a human body or the like. Note that the LCR resonance circuit 20 is not limited to a series resonance circuit, and may also be a parallel resonance circuit.

The smoothing circuit 30 has a half-wave rectifying diode 31, a fixed resistor 32 and a capacitor 33, constituting a low-pass filter, and an output impedance converting buffer circuit 34. The smoothing circuit 30 can have any circuit configuration, so long as it outputs a determination voltage signal S2 in accordance with the capacitance of the sensor electrode 22. Specifically, an inverting amplifier circuit, which inverts and amplifies the signal, may be added.

The microcomputer 40 has an ND converter 41, a control unit 42 and a high-frequency signal generation unit 43. The ND converter 41 performs A/D conversion of the determination voltage signal S2 input from the smoothing circuit 30, and outputs this to the control unit 42 as a determination signal S3. The control unit 42 will be described in detail below, but in addition to outputting a control signal S4 to the high-frequency signal generation unit 43, it outputs a human detection signal S5 when it has been judged that a human body has made contact with the door handle on the basis of the determination signal S3 (that a human body is in the proximity of the sensor electrode 22) and outputs a water detection signal S6 when it has been judged that water has made contact with the door handle (that water is in the proximity of the sensor electrode 22). The high-frequency signal generation unit 43, which serves as an oscillation means, will be described in detail below, but outputs a high-frequency signal S0, having a predetermined frequency and a predetermined duty ratio, to the LCR resonance circuit 20, on the basis of the control signal S4, input from the control unit 42.

Figure 2:
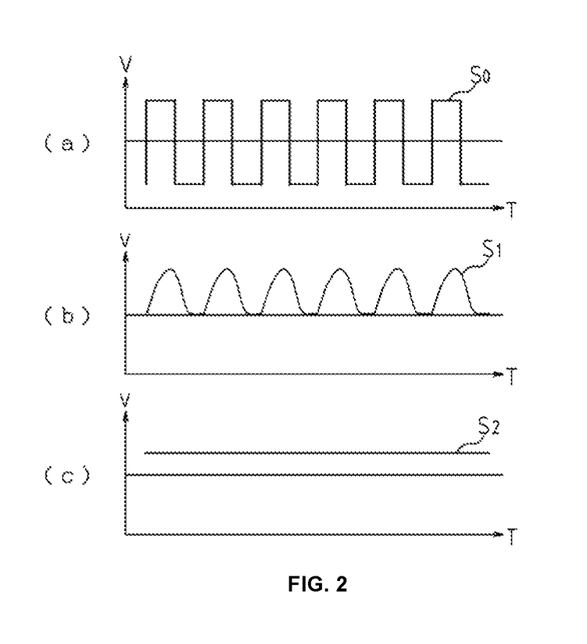
FIG. 2 is a graph serving to describe a voltage waveform during operations of a proximity sensor according to the first exemplary mode of embodiment of the present invention.

FIG. 2 shows a voltage waveform during operations of the proximity sensor 1 in this example. In this example, a rectangular wave high-frequency signal (generally, several hundred kilohertz) such as shown in FIG. 2(a) is used as the high-frequency signal S0, which is input to the LCR resonance circuit 20. Note that the high-frequency signal S0 is not limited to rectangular waves, but rather sine waves, triangular waves and the like may be used.

The high-frequency signal S0 that has been input to the LCR resonance circuit 20 is distorted by the inductor 21 and the sensor electrode (variable capacitance) 22 and becomes a waveform that is nearly a sawtooth wave, in which the rising edge and the trailing edge are delayed, which undergoes half-wave rectification by the diode 31. As a result, the voltage signal 51 at point B in FIG. 1 has a waveform such as shown in FIG. 2(b). When such a voltage signal 51 is input to the smoothing circuit 30, it is smoothed by the fixed resistor 32 and the capacitor 33, which constitute the low-pass filter, and a determination voltage signal S2 that is close to DC, such as shown in FIG. 2(c), is output.

Next, control of the high-frequency signal S0 in the proximity sensor is described.

In the LCR resonance circuit 20, where: the resonance frequency when a dielectric such as human body or the like is not in the proximity of the sensor electrode 22 is f1, the resonance frequency when a human body (hand) is in the proximity of the sensor 22 is f2, and the resonance frequency when water is in the proximity of the sensor 22 is f3, the relationship $$f1>f2>f3$$

is satisfied.

This is because, if a dielectric such as a human body touches the door handle, the capacitance of the sensor electrode 22 increases, and in cases in which, supposing the vehicle is being washed, a relatively large amount of water wets the door handle, the capacitance of the sensor electrode 22 will be greater than the capacitance of the sensor electrode 22 when a human body has touched the door handle.

Figure 3:
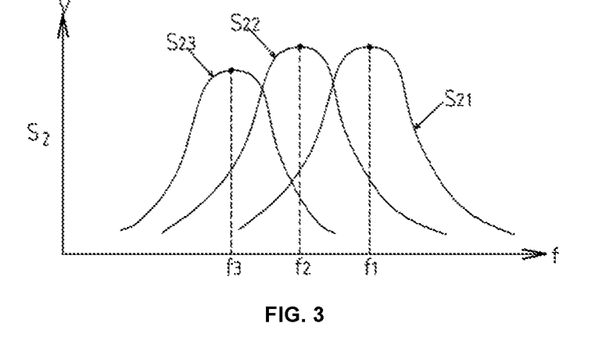
FIG. 3 is a graph serving to describe the control of a high-frequency signal in the proximity sensor of the present invention.

FIG. 3 shows the relationship between the frequency of the high-frequency signal S0 that is input to the LCR resonance circuit 20 and the determination voltage signal S2, when no object is in the proximity of the sensor electrode 22, when a human body is in the proximity, and when water is in the proximity. Note that the determination voltage signal S21 corresponds to the case in which no object is in the proximity of the sensor electrode 22, the determination voltage signal S22 corresponds to the case in which a human body is in the proximity of the sensor electrode 22, and the determination voltage signal S23 corresponds to the case in which water is in the proximity of the sensor electrode 22.

Figure 4:
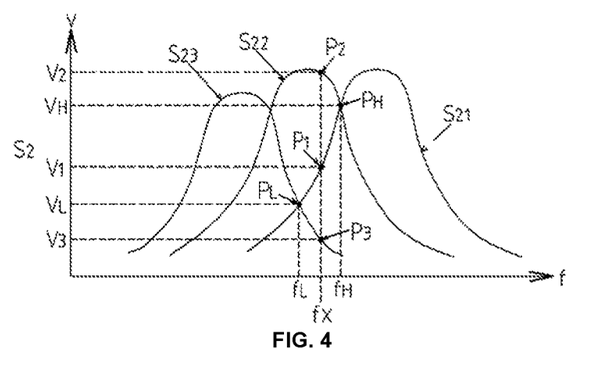
FIG. 4 is a graph serving to describe the control of a high-frequency signal in the proximity sensor of the present invention.

Here, as shown in FIG. 4, where: the frequency at the point PH where the graph for the determination voltage signal S21 and the graph for the determination voltage signal S22 intersect is fH, and the frequency at the point PL where the graph for the determination voltage signal S21 and the graph for the determination voltage signal S23 intersect is fL, by controlling the frequency fx of the high-frequency signal S0 so as to satisfy the relationship $$fL<fx<fH$$

it is possible to reliably distinguish between a human body and water.

In other words, by controlling the frequency fx of the high-frequency signal S0: the determination voltage signal V1 when no object is in the proximity of the sensor electrode 22 (voltage at point P1), the determination voltage signal V2 when a human body is in the proximity of the sensor electrode 22 (voltage at point P2), and the determination voltage signal V3 when water is in the proximity of the sensor electrode 22 (voltage at point P3), will always have the relationship $$V2>V1>V3.$$

That is to say, starting from a state in which no object is in the proximity the sensor electrode, the determination voltage signal will change in completely opposite directions, in the case when a human body is in the proximity of the sensor electrode 22 and in the case when water is in the proximity of the sensor electrode 22, and thus it will be possible to reliably distinguish between a human body and water.

In other words, if the determination voltage signal at the point PH is VH, and the determination voltage signal at the point PL is VL, by controlling the frequency fx of the high-frequency signal S0 so that the relationship $$VH>V1>VL$$

is satisfied, the relationship $$V2>V1>V3$$

will always be satisfied, and thus it will be possible to reliably distinguish between a human body and water.

The foregoing description is based on measurement results in a constant environment but if, for example, the environmental temperature changes, the LC characteristics in the LCR resonance circuit 20 will change slightly, and therefore the resonance frequency of the LCR resonance circuit 20 will change.

Figure 5:
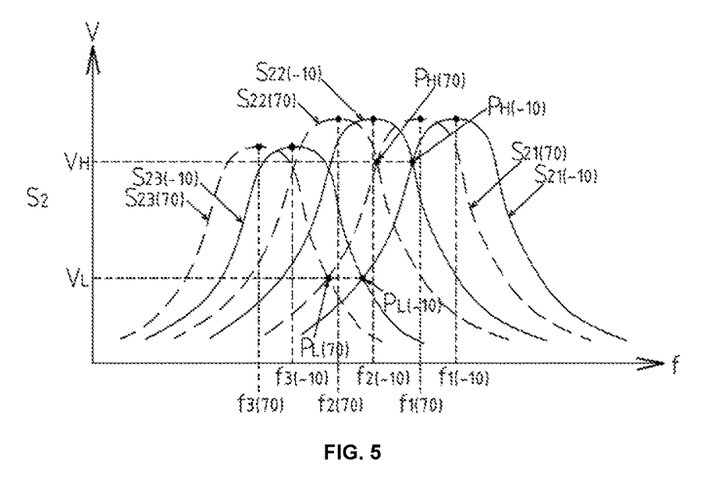
FIG. 5 is a graph serving to describe the control of a high-frequency signal in the proximity sensor of the present invention.

FIG. 5 shows the relationship between the frequency of the high-frequency signal S0 that is input to the LCR resonance circuit 20 and the determination voltage signal S2, when there is no object in the proximity of the sensor electrode 22, when there is a human body in the proximity, and when there is water in the proximity, the solid line indicating −10° C. and the dashed line indicating +70° C. Here: the determination voltage signals S21 (−10) and S21 (70) correspond to when no object is in the proximity of the sensor electrode 22, at −10° C. and +70° C., respectively; the determination voltage signals S22 (−10) and S22 (70) correspond to when a human body is in the proximity of the sensor electrode 22, at −10° C. and +70° C., respectively; and the determination voltage signals S23 (−10) and S23 (70) correspond to when water is in the proximity of the sensor electrode 22, at −10° C. and +70° C., respectively. Note that, in FIG. 5: f1 (−10) and f1 (70) indicate the resonance frequency when no object is in the proximity of the sensor electrode 22, at −10° C. and +70° C., respectively; f2 (−10) and f2 (70) indicate the resonance frequency when a human body is in the proximity of the sensor electrode 22, at −10° C. and +70° C., respectively; and f3 (−10) and f3 (70) indicate the resonance frequency when water is in the proximity of the sensor electrode 22, at −10° C. and +70° C., respectively.

As shown in FIG. 5, when the environmental temperature increases, the resonance frequency of the LCR resonance circuit 20 decreases. However, the value of the determination voltage signal VH at the point PH (−10) where the graph for determination voltage signal S21 (−10) and the graph for the determination voltage signal S22 (−10) intersect, and at the point PH (70) where the graph for the determination voltage signal S21 (70) and the graph for the determination voltage signal S22 (70) intersect is substantially constant, even if the environmental temperature changes. Furthermore, the value of the determination voltage signal VL at the point PL (−10) where the graph for determination voltage signal S21 (−10) and the graph for the determination voltage signal S23 (−10) intersect, and at the point PL (70) where the graph for the determination voltage signal S21 (70) and the graph for the determination voltage signal S23 (70) intersect is also substantially constant, even if the environmental temperature changes.

Consequently, by controlling the frequency of high-frequency signal S0 so that the determination voltage signal V1 when no object is in the proximity of the sensor electrode 22 satisfies the relationship, $$VH>V1>VL,$$

even if the environmental temperature changes, $$V2>V1>V3$$

will always be satisfied, and thus it will be possible to reliably distinguish between a human body and water.

Figure 6:
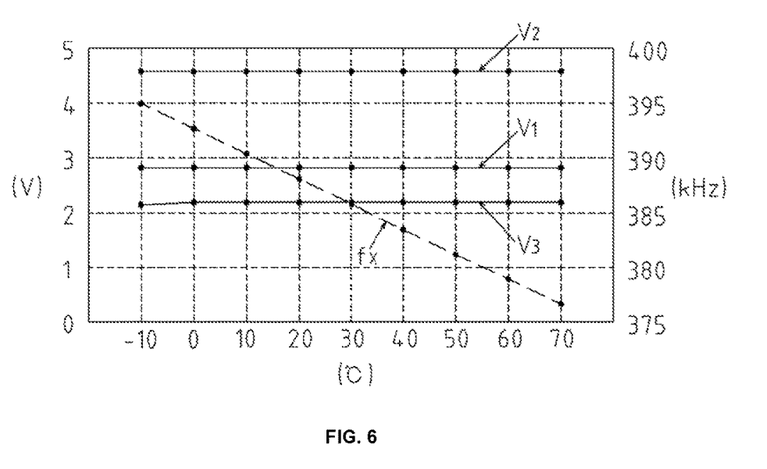
FIG. 6 is a graph showing the relationship between environmental temperature and a determination voltage signal V2 when a human body is in the proximity, and a determination voltage signal V3 when water is in the proximity, when the frequency fx of a high-frequency signal S0 has been controlled so that a determination voltage signal V1 when nothing is in the proximity is controlled so as to be 2.8 V, regardless of environmental temperature, in the proximity sensor according to the first exemplary mode of embodiment of the present invention.

With the proximity sensor 1 of this example, In FIG. 6 shows the relationship between environmental temperature and: the determination voltage signal V2 when a human body is in the proximity, and the determination voltage signal V3 when water is in the proximity, when the frequency fx of the high-frequency signal S0 was controlled so that the determination voltage signal V1 when no object is in the proximity of the sensor electrode 22 is constant, regardless of environmental temperature.

As shown in FIG. 6, in this example, by suitably controlling the frequency fx of the high-frequency signal S0 within a range of approximately 395 kHz to 377 kHz, in an environmental temperature range of −10° C. to 70° C., the determination voltage signal V1 is controlled at a constant value (approximately 2.8 V). By controlling the frequency fx of the high-frequency signal S0 in accordance with changes in the environmental temperature in this manner, it is possible to maintain the determination voltage signal V2 when a human body is in the proximity at a constant value of approximately 4.6 V, and to maintain the determination voltage signal V3 when water is in the proximity at a constant value of approximately 2.1V, and thus it is possible to reliably distinguish between a human body and water, even if the environmental temperature changes.

Next, in the present invention, another method for controlling the high-frequency signal S0 so that the relationship of $$V2>V1>V3$$

is satisfied will be explained.

Figure 7:
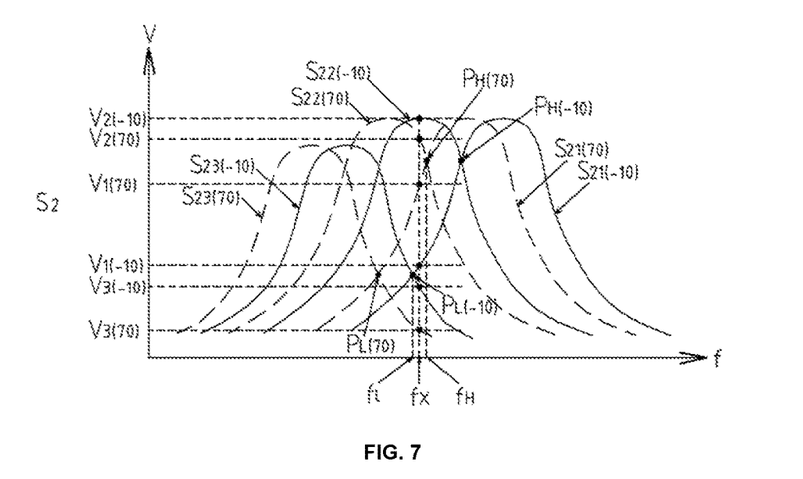
FIG. 7 is a graph serving to describe the control of a high-frequency signal in the proximity sensor of the present invention.

In the same manner as FIG. 5, FIG. 7 shows the relationship between the frequency of the high-frequency signal S0 that is input to the LCR resonance circuit 20 and the determination voltage signal S2, when no object is in the proximity, when a human body (hand) is in the proximity, and when water is in the proximity.

Here, as shown in FIG. 7, where the frequency of the high-frequency signal S0 at the point PH (70) where the graph for the determination voltage signal S21 (70) and the graph for the determination voltage signal S22 (70) intersect is fH, and the frequency of the high-frequency signal S0 at the point PL (−10) where the graph for the determination voltage signal S21 (−10) and the graph for the determination voltage signal S23 (−10) intersect is fL, by controlling the frequency fx of the high-frequency signal S0 so as to satisfy the relationship $$fL<fx<fH,$$

it is possible to reliably distinguish between a human body and water, even if the environmental temperature changes.

In other words, by controlling the frequency fx of the high-frequency signal S0 as described above, for example in a −10° C. environment, the determination voltage signal V1 (−10) when no object is in the proximity of the sensor electrode 22, the determination voltage signal V2 (−10) when a human body is in the proximity of the sensor electrode 22 and the determination voltage signal V3 (−10) when water is in the proximity of the sensor electrode 22 will always be in the relationship $$V2(-10)>V1(-10)>V3(-10)$$

Furthermore, in a 70° C. environment, the determination voltage signal V1 (70) when no object is in the proximity of the sensor electrode 22, the determination voltage signal V2 (70) when a human body is in the proximity of the sensor electrode 22, and the determination voltage signal V3 (70) when water is in the proximity of the sensor electrode 22 will always be in the relationship $$V2(70)>V1(70)>V3(70)$$

That is to say, by controlling the frequency fx of the high-frequency signal S0 so as to satisfy the relationship $$fL<fx<fH$$

even if the environmental temperature changes, starting from the state in which no object is in the proximity of the sensor electrode, the determination voltage signal will change in completely opposite directions, in the case when a human body is in the proximity of the sensor electrode, and the case when water is in the proximity of the sensor electrode, and thus it will be possible to reliably distinguish between a human body and water.

In the proximity sensor 1 in this example, the frequency fx of the high-frequency signal S0 was controlled to 390 kHz so that, in FIG. 7, fL was approximately 385 kHz and fH was approximately 395 kHz.

Figure 8:
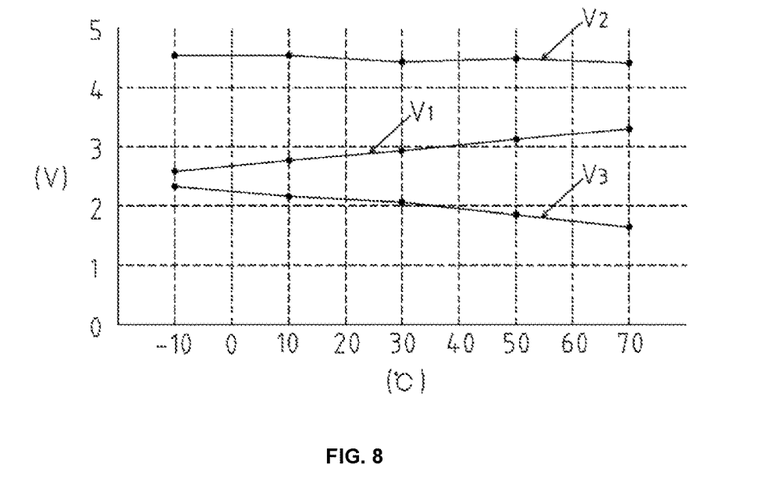
FIG. 8 is a graph showing the relationship between environmental temperature and output signal voltages when nothing is in the proximity, when a human body is in the proximity, and when water is in the proximity, when the frequency fx of the high-frequency signal S0 is controlled to be 390 kHz, regardless of environmental temperature, in the proximity sensor according to the first exemplary mode of embodiment of the present invention.

With the proximity sensor 1 of this example, FIG. 8 shows the relationship between the environmental temperature and: the determination voltage signal V1 when there is nothing in the proximity, the determination voltage signal V2 when a human body is in the proximity, and the determination voltage signal V3 when water is in the proximity, when the frequency of the high-frequency signal was controlled to 390 kHz, regardless of the environmental temperature.

As shown in FIG. 8, by controlling the frequency fx of the high-frequency signal S0 to approximately 390 kHz, with the environmental temperature in a range of −10° C. to 70° C., in this example, the relationship $$V2>V1>V3$$

is satisfied, and thus it is possible to reliably distinguish between a human body and water, even if the environmental temperature changes.

As described above, in this example, where:

f1 is the resonance frequency of the LCR resonance circuit 20 and V1 is the determination voltage signal, when no object is in the proximity of the sensor electrode 22, f2 is the resonance frequency of the LCR resonance circuit 20 and V2 is the determination voltage signal, when a human body is in the proximity of the sensor electrode 22, and f3 is the resonance frequency of the LCR resonance circuit 20 and V3 is the determination voltage signal, when water is in the proximity of the sensor electrode 22, having the relationship $$f1>f2>f3,$$

by controlling the high-frequency signal S0 so as to satisfy V2>V1>V3, it is possible to reliably distinguish between a human body and water being in the proximity of the sensor electrode.

Furthermore, in terms of methods for controlling the high-frequency signal S0, methods can be adopted in which, for example, the frequency of the high-frequency signal S0 is controlled so that V1 is substantially constant, as described using FIG. 5 and FIG. 6, or methods can be adopted in which the frequency fx of the high-frequency signal S0 is controlled to a frequency between fL and fH, as described using FIG. 7 and FIG. 8.

Figure 9:
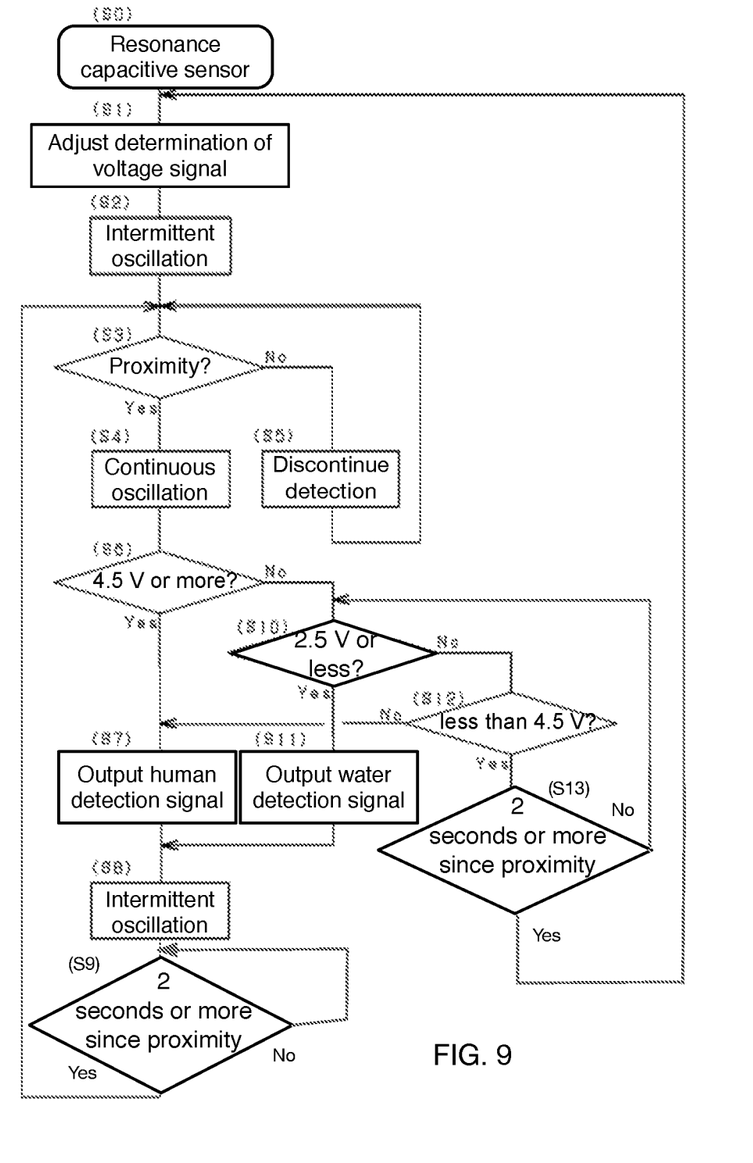
FIG. 9 is a flowchart serving to describe the detection processing performed in the proximity sensor according to the first exemplary mode of embodiment of the present invention.

Next, an example of the operations for detecting a human body and water with the proximity sensor of the present invention will be described using the flow chart in FIG. 9.

Step S0

First, if a user carrying an electronic key approaches the vehicle, wireless communication is performed between the authentication system installed in the vehicle and the electronic key, and this is authenticated as being an authorized electronic key for the vehicle. Note that, this authentication can be performed by known authentication methods for smart entry systems.

Step S1

At the point in time at which the authorized electronic key has been authenticated, the situation is one in which an object still has not approached the sensor electrode 22. The control unit 42 adjusts the determination voltage signal V1 in this state. In this determination voltage signal adjustment, the determination voltage signal V1 when no object is in the proximity of sensor electrode 22 is adjusted so as to be approximately 2.8 V (in the range of 2.7 V to 2.9 V), by controlling the frequency fx of the high-frequency signal S0 (continuous oscillation) as in FIG. 6.

Note that, frequencies at which the determination voltage signal will be the same level exist on the low-frequency side and on the high-frequency side with respect to the resonance frequency f1, and thus the frequency fx of the high-frequency signal S0 is controlled to the low-frequency side, with respect to the resonance frequency f1, by observing the increase or decrease in the determination voltage signal V1 that accompanies the increase or decrease in the frequency fx of the high-frequency signal S0.

Step S2

Next, the control unit 42 causes the high-frequency signal S0, having the frequency adjusted in step S1, to be oscillated intermittently, at a predetermined duty ratio. This is because, making use of the fact that, when the duty ratio is less than a predetermined value, even if a human body approaches the sensor electrode 22, the determination voltage signal will drop in the same manner as for water, either a human body or water being in the proximity of the sensor electrode will be detected. This intermittent oscillation is a step included in order to reduce power consumption, but in this case, it is not possible to distinguish whether a human body or water is in the proximity of the sensor electrode.

Step S3->Step S4

If the determination voltage signal drops to a predetermined value or lower, it is possible that either a human body or water is in the proximity of the sensor electrode, and therefore, the system switches from intermittent oscillation to continuous oscillation, and standard detection is performed.

Step S3->Step S5

If no drop in the determination voltage signal is seen, it is considered that nothing is in the proximity, thus detection is temporarily discontinued, and detection subsequently continues with intermittent oscillation.

Step S6

If a drop is seen in the determination voltage signal, it is possible that either a human body or water is in the proximity, and therefore the system switches to continuous oscillation, a determination is made as to whether or not the determination voltage signal is 4.5 V or higher, and if it is 4.5 V or higher, the system advances to step S7, while if it is not 4.5 V or higher, the system advances to step S10.

Step S7

Because the determination voltage signal when no object is in the proximity of the sensor electrode 22 is adjusted to approximately 2.8 V in step 1, as shown in FIG. 6, when a human body is in the proximity of the sensor electrode 22, the determination voltage signal becomes approximately 4.6 V, and a human body detection signal S5 is output for detection of a human body. Note that, when a human body detection signal S5 is output, a door lock mechanism provided in the outer panel of the door is controlled so as to unlock or lock the vehicle door.

Step S8

When a human body detection signal S5 is output, the system switches from continuous oscillation to intermittent oscillation.

Step S9

When 2 seconds or more has elapsed since detection of proximity in step S3, the system returns to step S3 and detection of whether or not a human body or water is in the proximity of the sensor electrode continues to be performed with intermittent oscillation. Note that, the reason for which detection is only performed again after 2 seconds or more has elapsed is so that the vehicle door will not be unlocked or locked continuously in very short time intervals.

Step S10

If the determination voltage signal is not 4.5 V or higher in step S6, a determination is made as to whether or not the determination voltage signal is 2.5 V or lower, and if it is 2.5 V or lower, the system advances to step S11, while if it is not 2.5 V or lower, the system advances to step S12.

Step S11

Because the determination voltage signal when no object is in the proximity of the sensor electrode 22 is adjusted to approximately 2.8 V in step 1, as shown in FIG. 6, when water is in the proximity of the sensor electrode 22, the determination voltage signal becomes approximately 2.1 V, a water detection signal S6 is output for detection of water, and the system advances to step S8, whereafter the same procedure is repeated.

Step S12

If the determination voltage signal is not 2.5 V or lower in step S10, a determination is made as to whether or not the determination voltage signal is less than 4.5 V.

If the determination voltage signal is not less than 4.5 V, the system advances to step S7, whereafter the same procedure is repeated.

If the determination voltage signal is less than 4.5 V, the system advances to step S13. Step S13

If 2 seconds or more has not elapsed since the detection of proximity in step S3, the system returns to step S10. Meanwhile, if 2 seconds or more has elapsed since the detection of proximity in step S3, it is considered that neither a human body nor water was detected, and the system returns to step S1, whereafter the same procedure is repeated. Note that the reason for which water determination has a 2 second time period is that it is possible that the signal drop be delayed, depending on the way the water is applied.

Thus, by using the proximity sensor 1 of this example as a sensor for unlocking and locking vehicle doors, it is possible to reliably distinguish between the proximity of relatively large amounts of water, when washing the vehicle or the like, and a human body, and thus it is possible to prevent the door locking mechanism from being unintentionally repeatedly operated, for example when washing the vehicle.

Second Exemplary Mode of Embodiment

Figure 10:
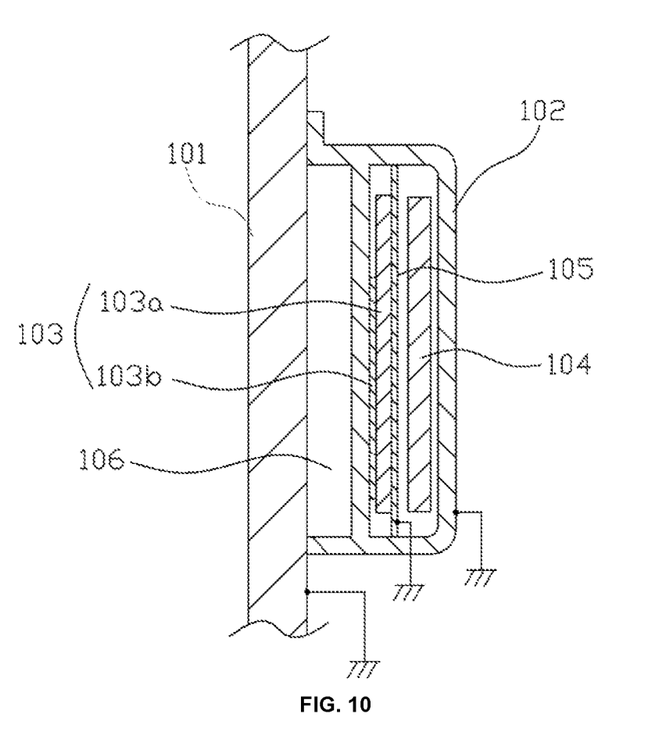
FIG. 10 is a sectional view schematically illustrating one example of a door handle device comprising the proximity sensor of the present invention.

FIG. 10 is a sectional view schematically illustrating a door handle device according to a second exemplary mode of embodiment of the present invention. The door handle device in this example is a door handle device for vehicles, and is provided with a proximity sensor for unlocking doors in a so-called smart entry system.

The door handle device in this example comprises a door handle 102, which is mounted to an outer panel 101 of a vehicle door, a proximity sensor 103, which is provided in an internal space in the door handle 102, and an antenna 104. The proximity sensor 103 is the same as the proximity sensor in the first exemplary mode of embodiment, wherein a sensor electrode 103b is mounted on a sensor board 103a, on which a sensor circuit and a microcomputer are mounted. The sensor board 103a is disposed so that the sensor electrode 103b faces the vehicle door main body side (which is to say the side of the outer panel 101). The antenna 104 serves to provide wireless communication with an electronic key carried by the user.

When a person opens the door, upon touching the door handle 102 by inserting a finger into a gap 106 between the outer panel 101 and the door handle 102, the capacitance of the sensor electrode 103b increases such that a human body can be detected in the same manner as in the first exemplary mode of embodiment, and based on this detection signal, the door locking mechanism (not shown) is controlled so as to unlock the vehicle door.

Note that, if a person grasps the door handle 102 strongly and the palm of the hand touches the outer surface of the door handle (right side surface in FIG. 10), the sensor circuit may be influenced by the capacitive coupling from the outer surface of the door handle, which may lead to changes in the frequency characteristics thereof or the like. For this reason, a shield electrode (shield plate) 105 is formed on the back face of the sensor board 103a, on which the sensor electrode 103b is not formed. This makes it possible to effectively suppress the influence of capacitive coupling from the outer surface of the door handle 102, allowing for increased accuracy in detecting human bodies.

Furthermore, if the door handle 102 is made from resin, the determination voltage signal may rise for a very short period of time when wetting with water begins. For this reason, it is preferable that the door handle 102 be made from metal, or that an electroconductive material be used for the surface thereof. This allows erroneous determinations of human bodies or water to be even more reliably prevented.

Exemplary modes of embodiment of the present invention were described above, but the present invention is not limited to these exemplary modes of embodiment, and it is a matter of course that the exemplary modes of embodiment described above can be suitably modified or the like, within a range that does not depart from the gist of the present invention.

For example, in the first exemplary mode of embodiment, the control unit 42 in FIG. 1 controlled the high-frequency signal S0 so that the relationship $$V2>V1>V3$$

is satisfied, but if the LCR resonance circuit 20 is configured as a parallel resonance circuit, or an inverting amplifier circuit is added to the sensor circuit, the control unit 42 may control the high-frequency signal S0 so that the relationship $$V3>V1>V2$$

is satisfied.

Furthermore, in the exemplary mode of embodiment described above, a case in which the proximity sensor was mounted in a vehicle door handle was described, but the capacitive proximity sensor of the present invention can also be applied to doors in homes, offices and the like.

Furthermore, in the exemplary mode of embodiment described above, a case was described in which, when the proximity of an object has been detected, control is performed so as to lock and unlock a door but, for example, various types of interior or exterior illumination and indication lights may be controlled on and off.

What is claimed is:

1. A capacitive proximity sensor comprising:
an oscillation means, which outputs a high-frequency signal;
a sensor circuit, having an LCR resonance circuit, including a sensor electrode, into which the high-frequency signal is input, and which outputs a determination voltage signal in accordance with the capacitance of the sensor electrode; and
a control unit, which detects the proximity of a human body to the sensor electrode, on the basis of the determination voltage signal;
wherein the resonance frequency of the LCR resonance circuit is f1 and the determination voltage signal is V1, when an object is not in the proximity of the sensor electrode,
wherein the resonance frequency of the LCR resonance circuit is f2 and the determination voltage signal is V2, when the human body is in the proximity of the sensor electrode, and
wherein the resonance frequency of the LCR resonance circuit is f3 and the determination voltage signal is V3, when water is in the proximity of the sensor electrode,
wherein f1>f2>f3,
wherein the control unit controls the frequency of the high-frequency signal so as to satisfy the relationship V2>V1>V3 or V3>V1>V2,
wherein the control unit controls the frequency of the high-frequency signal so that V1 is substantially constant,
and wherein the human body or water in the proximity of the sensor electrode is distinguished.

2. A door handle device comprising a door handle mounted to an outer panel of a vehicle door, and a capacitive proximity sensor, wherein:
the door handle has a space at the interior thereof, and
the capacitive proximity sensor is disposed within the space; and
the capacitive proximity sensor comprises:
an oscillation means, which outputs a high-frequency signal;
a sensor circuit, having an LCR resonance circuit, including a sensor electrode, into which the high-frequency signal is input, and which outputs a determination voltage signal in accordance with the capacitance of the sensor electrode; and
a control unit, which detects the proximity of a human body to the sensor electrode, on the basis of the determination voltage signal;
wherein the resonance frequency of the LCR resonance circuit is f1 and the determination voltage signal is V1, when an object is not in the proximity of the sensor electrode,
wherein the resonance frequency of the LCR resonance circuit is f2 and the determination voltage signal is V2, when the human body is in the proximity of the sensor electrode, and wherein the resonance frequency of the LCR resonance circuit is f3, and the determination voltage signal is V3, when water is in the proximity of the sensor electrode, wherein f1>f2>f3, wherein the control unit controls the frequency of the high-frequency signal so as to satisfy the relationship V2>V1>V3 or V3>V1>V2, wherein the control unit controls the frequency of the high-frequency signal so that V1 is substantially constant, and wherein the human body or water in the proximity of the sensor electrode is distinguished.

3. The door handle device according to claim 2, wherein:
the sensor electrode is formed on a board so that the sensor electrode faces the outer panel; and
a shield electrode is formed on a back face of the board, wherein the back face of the board does not have the sensor electrode formed thereon.

4. The door handle device according to claim 3, wherein:
the surface of the door handle is electroconductive.

5. A capacitive proximity sensor comprising:
a control unit which generates a control signal;
an oscillation means, which receives the control signal and which outputs a high-frequency signal controlled by the control signal;
an LCR resonance circuit which includes a sensor electrode that alters capacitance in response to either one or both of proximity or contact with an object, thereby altering capacitance of the LCR resonance circuit, the LCR resonance circuit receiving the high-frequency signal from the oscillation means and outputting in response a waveform; and
a smoothing circuit which receives the waveform from the LCR resonance circuit and generates in response a determination voltage signal in accordance with the capacitance of the sensor electrode;
wherein the control unit, the oscillation means, and the LCR resonance circuit are configured so that f1>f2>f3, where f1 is the resonance frequency of the LCR resonance circuit when said object is not in the proximity of the sensor electrode, where f2 is the resonance frequency of the LCR resonance circuit when a human body is the object in the proximity of the sensor electrode, and f3 is the resonance frequency of the LCR resonance circuit when water is the object in the proximity of the sensor electrode, and so that either one of V2>V1>V3 or V3>V1>V2 is satisfied, where V1 is the voltage of the determination voltage signal when the object is not in the proximity of the sensor electrode, where V2 is the voltage of the determination voltage signal when the human body is in the proximity of the sensor electrode, and where V3 is the voltage of the determination voltage signal when water is in the proximity of the sensor electrode;

wherein the control unit analyzes the voltage determination signal to determine when the human body provides the capacitive proximity sensor input to the sensor electrode, to determine when water provides the capacitive proximity sensor input to the sensor electrode, and to determine when neither the human body nor water provides input to the capacitive proximity sensor at the sensor electrode;

wherein the control unit generates an output of the capacitive proximity sensor discerning human body detection from water detection, and discerning human body detection from the absence of each one of the human body and water at the sensor electrode.

6. The capacitive proximity sensor of claim 5, wherein the control unit adjusts the control signal to control the frequency of the high-frequency signal so that V1 is substantially constant.

7. The capacitive proximity sensor of claim 5 in combination with a door handle, the capacitive proximity sensor formed in the door handle mounted to an outer panel of a vehicle door, wherein the sensor electrode is formed on a board situated in the door handle, so that the sensor electrode is on an outer panel side of the board; and
a shield electrode is formed on a back face of the board opposite the outer panel side, wherein the back face of the board does not have the sensor electrode formed thereon.

* * * * *